(12) United States Patent
Pulfer (10) Patent No.: US 10,691,852 B2
(45) Date of Patent: Jun. 23, 2020

(54) MODEL BASED ANALYSIS AND CONTROL OF A REAL-WORLD SYSTEM

(71) Applicant: Stefanie Pulfer, Kirchseelte (DE)

(72) Inventor: Roland Pulfer, Kirchseelte (DE)

(73) Assignee: Stefanie Pulfer, Kirchseeite (DE)

( * ) Notice: Subject to any disclaimer, the term of this patent is extended or adjusted under 35 U.S.C. 154(b) by 222 days.

(21) Appl. No.: 15/650,052

(22) Filed: Jul. 14, 2017

(65) Prior Publication Data

US 2018/0018415 A1 Jan. 18, 2018

(30) Foreign Application Priority Data

Jul. 14, 2016 (CH) ..................................... 00898/16

(51) Int. Cl.
*G06F 30/33* (2020.01)
*G06Q 10/06* (2012.01)

(52) U.S. Cl.
CPC ......... *G06F 30/33* (2020.01); *G06Q 10/0635* (2013.01)

(58) Field of Classification Search
None
See application file for complete search history.

(56) References Cited

U.S. PATENT DOCUMENTS

| 8,027,859 | B2 * | 9/2011 | Pulfer | G06Q 10/06 705/7.22 |
| 9,137,110 | B1 * | 9/2015 | Adogla | H04L 41/082 |
| 10,275,730 | B2 * | 4/2019 | Cope | G06Q 10/06311 |
| 2014/0278294 | A1 * | 9/2014 | Yeager | G06F 17/5009 703/2 |
| 2016/0019484 | A1 * | 1/2016 | Srivastava | G06Q 10/06313 705/7.17 |

OTHER PUBLICATIONS

Lipkus et al. "The Visual Communication of Rise", Journal of the NAtional Cancer Institute Monographs No. 25, 1999, pp. 149-163. (Year: 1999).*
European Search Report for application No. EP 17181377, completed Oct. 23, 2017.

* cited by examiner

*Primary Examiner* — Suzanne Lo
(74) *Attorney, Agent, or Firm* — Oppedahl Patent Law Firm LLC (57) ABSTRACT

A method for the analysis, based on a computer model of a real-world system whose entities are represented by software objects (artefacts) for: risks of real-world events occurring (risk artefacts); actions in the real-world system (action artefacts), associated with tasks, resources and conditions; and in which a subset of the model is represented by a system context. The method comprises defining actions required to accomplish a target task, thereby allocating resources to actions; computing a manageability index of the at least one system context, representing an extent to which resources are available; computing a feasibility index of the at least one system context, representing an extent to which actions are possible; computing an aggregated risk of the at least one system context; creating and displaying, on a display device, a visual representation of the aggregated risk, the manageability index and the feasibility index of the at least one system context.

18 Claims, 5 Drawing Sheets

| action | resource 1 | resource 2 | timeline | risk | status |
|---|---|---|---|---|---|
| action 1 | 4.5.2016 | 4.5.2016 | 4.5.2016 | 4.5.2016 | active |
| action 2 | 4.5.2016 | 4.5.2016 | 4.5.2016 | 4.5.2016 | active |
| action 3 | 4.5.2016 | 4.5.2016 | 4.5.2016 | 4.5.2016 | active |
| action 4 | 4.5.2016 | 4.5.2016 | 4.5.2016 | 4.5.2016 | completed |
| action 5 | 4.5.2016 | 4.5.2016 | 4.5.2016 | 4.5.2016 | active |
| action 6 | 4.5.2016 | 4.5.2016 | 4.5.2016 | 4.5.2016 | on hold |

Fig. 4

MODEL BASED ANALYSIS AND CONTROL OF A REAL-WORLD SYSTEM

The invention relates to the field of modelling and controlling real-world systems. It relates to a computer-implemented method for model based analysis of a real-world system and a corresponding data processing system and computer program product.

Models of real-world systems (or simply "systems") that are used for analysis and (closed-loop) control of such systems usually are abstractions and simplifications of the systems. However, reality is complex. There is a lack of a modelling and analysis procedure that allows for an adequate representation of a system's complexity and nonetheless supports the generation of high-level information about the system, allowing for a meaningful analysis without getting bogged down in details, and allows for controlling the system, that is, acting on the system, in order to achieve a desired state or output of the system.

It is therefore an object of the invention to create a computer-implemented method for model based analysis of a real-world system, of the type mentioned initially, and a corresponding data processing system and computer program product, that overcome the disadvantage mentioned above.

The computer-implemented method for model based analysis of a real-world system, comprises:

providing a computer model, the computer model being a computer-based representation of the real-world system;

representing, in the computer model, entities of the real-world system by artefacts, an artefact being a software object, an artefact comprising attributes representing properties of the entities of the real-world system;

representing, in the computer model, risks of real-world events occurring by risk artefacts;

representing, in the computer model, actions within the real-world system, by action artefacts, an action artefact being associated with a task accomplished by the action, resources required to perform the action, and conditions that must be satisfied for the action to be performed;

at least one input apparatus receiving input data characterising properties the real-world system;

initialising or updating attributes of the artefacts according to the input data;

defining at least one system context, a system context comprising a subset of the artefacts of the computer model;

defining at least one target task to be accomplished within the real-world system;

determining, by means of a planning subsystem, a roadmap for accomplishing the target task, the roadmap defining a set of actions within the real world required to accomplish the target task and an allocation of resources to the actions, the planning subsystem taking into account planning parameters for guiding the planning;

computing, from the roadmap, a manageability index of the at least one system context, the manageability index representing an extent to which resources required for actions represented by the action artefacts of the at least one system context are available;

computing, from the roadmap, a feasibility index of the at least one system context, the feasibility index representing an extent to which actions required for action artefacts of the at least one system context are possible;

computing, from the risk artefacts of the at least one system context, an aggregated risk of the at least one system context for artefacts comprised by the at least one system context;

creating and displaying, on a display device, a visual representation of the aggregated risk, the manageability index and the feasibility index of the at least one system context.

The visualisation corresponds to a mathematical and system theoretical abstraction of the real-world system's resilience. The resilience is expressed in terms of manageability and feasibility. In addition, the visualisation can show dependencies including their strength and direction, risks and risk dependencies, including their strength, impact, direction, and corresponding actions.

The system can be a technical system such as a critical infrastructure, production line, manufacturing plant, chemical plant, vehicle fleet, railroad system, a single vehicle, computer network, etc, or a combination of such systems ("system of systems"). The system can be fully automated or can involve interaction with humans, e.g. for inputting data to the system.

The system can be of arbitrary complexity, and in order to handle this complexity, the computer model can be structured in a hierarchical manner, by e.g. defining subsystems and modelling aspects of the subsystems in more or less detail, depending on the purpose for which the computer model is used. For example, when modelling an industrial robot, it can be sufficient to model each of its joints by representing its angle by an attribute "angle". However, if the dynamics of its movement is also important, then the masses of the links and the speed and acceleration for each joint can be modelled in order to determine the angle. At an even further level of detail, currents, voltages of electrical drives for the joints can be modelled in addition, in order to determine the joint angle. In each case, at a higher level there will be a subsystem "joint" with an attribute "angle", and the value for this attribute is computed in a different way, depending on the underlying model.

Thus, systems or subsystems (depending on the point of view) can be an industrial robot, components such as joints and links of the robot, sensors, scouts, a controller that drives the robot and processes sensor data, objects handled by the robot, a manufacturing line comprising multiple robots, an entire plant, a network of plants in combination with a transport vehicles and a computer network linking the plants.

Artefacts are software objects in the sense of object oriented programming. An artefact represents an entity of the real word and can be one of a variety of types, representing, for example: a service, process, an activity, a product, a work product, a value chain, a person, an IT system, a software application, a legal entity, a location, infrastructure, a tool, a risk, an action, a measurement, a controller (or controlling entity, a task, a project, an influence, technical architecture element, etc.

In order to model a real system, artefacts in the model are created as instances of class definitions. An artefact comprises attributes (properties), functions or methods that the entity can perform, and rules (e.g. preconditions, postconditions and exceptions for such functions). As known in the object-oriented programming paradigm, additional artefacts ("special artefacts") can be defined in terms of an existing artefact by inheriting its properties such as attributes, functions, rules, etc. from the existing artefact and adding further properties.

Artefacts can be of high complexity. For example, the value chain artefact can represent a flow of materials and information through a manufacturing system on several levels, such as a process level (e.g. the products being handled), a support level (e.g. required machines, facilities) and an information and function level (e.g. associated data and computer infrastructure). For an example, see U.S. Pat. No. 7,941,301 B2, where the value chains are called "event chains", and in particular FIGS. 12-14 and the associated text.

A risk artefact is usually attached to another artefact and represents the risk of an event related to the other artefact occurring. The risks of real world events occurring can express the risk that a real-world-entity is non-functional or only partly functional. Typically, an attribute representing this risk is expressed in terms of attribute values of this other artefact and/or further artefacts. For example such an expression could express the following (stated in pseudocode), given artefacts representing a robot, a task performed by the robot, and a maintenance activity that includes calibrating the robot:

"if the time of the last maintenance activity is more than 2 months ago, then the risk for the calibration being imprecise is medium".

"if the calibration is imprecise, then the chance of the task failing is 20%"

Such relations can of course also be expressed by mathematical formulae, given numerical values for the attributes. For examples, see U.S. Pat. No. 7,941,301 B2, in particular the section labelled "Risk analysis".

The other artefacts can be on a lower level in a hierarchy of artefacts, and thus a risk associated with a higher level artefact can be computed from one or more risks of lower level artefacts. This risk can be considered an aggregated risk. Depending on the type of risk, aggregation can be performed in different ways. For example, if a manufacturing line comprises a linear sequence of stations, then the risk of the failure of the complete line can be computed from the risk of failure of the individual stations.

Attribute values expressing values of a risk, manageability, feasibility, susceptibility, relation, dependency (and their aggregations) can be expressed by numerical values, logical values, fuzzy logic values, or textual values. Relations, rules and aggregation functions that process these attributes are expressed accordingly, i.e. as mathematical, logical, fuzzy logic or rule-based functions.

Action artefacts are associated with resources required to accomplish a task by performing an action, which in turn can be expressed by plurality of further actions or sub-actions. Resources can be raw materials or intermediate products (represented by product artefacts), machines (represented by infrastructure artefacts), a time duration during which the machines are used. If more than one action is required, then a planning subsystem can take into account the conditions that must be satisfied for each action to be performed and to determine a sequence of the actions.

An input apparatus receiving input data characterising properties the real-world system can be the measuring of sensor values and/or reading data from computers that are part of the real-world system, or the inputting of data by a user. The input apparatus can be one or more of: input devices for inputting data by human users, hardware sensors measuring physical properties, data capturing programs or devices arranged to record data stored in computer systems or transmitted between computer systems and to provide this data to a system executing the model based analysis described herein. By continuously updating the model in this manner, a "living model" representing the actual state of the real-world system is maintained.

The step of defining a system context serves to separate a subset of the complete model, in order to determine and analyse properties of the subset and thus also of a corresponding subsystem of the real-world system. This can be done for one or more subsystems at the same time. For example For each system context, aggregated properties are computed, which give a high-level information about the state of this system context. This high-level information represents a combination of low-level information about the state of the real-world system that is spread throughout the artefacts of the system context, and gives an abstraction of the state of the real-world system that can be used for assessment of this state in a meaningful manner. This in turn allows—automatically or with a human in the loop—to choose actions to be performed, to set or modify target tasks, or to modify the real-world system in other way.

The target task to be accomplished within the real-world system can be on the hand a task expressing normal operation of the system. Such a task can be e.g. "produce 10,000 products of type X". On the other hand, a target task can be a task to change the system, for example, "move robot A from production line B to line C". In the each case, the model must comprise action artefacts representing such a change.

Defining tasks can comprise defining a main task that comprises other tasks (which in relation to the main task can be considered as subtasks or dependent and related tasks). The task can be a task performed by the system as a whole, or only by the system context.

The planning, i.e. the operation of the planning subsystem can involve only the system context or the entire system. Given the target task, which usually is broken down into a number of subtasks, the planning subsystem selects actions—described by action artefacts—for each subtask and schedules the actions taking into account the associated resources and conditions. The conditions impose a particular order of the actions, and since resources can be required by more than one action, their allocation to actions over time must be coordinated. This type of planning can involve known scheduling methods. Scheduling is the process of arranging, controlling and optimizing work and workloads in a process, for example, in job shop scheduling. Scheduling can be implemented by a variety of methods such as dynamic programming, stochastic methods, heuristic algorithms etc. The planning searches for an optimum, even if e.g. not all resources can be allocated or a given time constraint for accomplishing the target task can be satisfied. Planning parameters can be optimisation criteria, such as objective functions and constraint functions for a multi-objective optimization problem. They can be set by a user. They express, for example, a relative importance of the objective functions, e.g. expressing that it is more important to have a task completed within a given time, even if this means compromising quality or a risk for failures due to overloaded machines.

In order to assess the result of the planning step, it can be represented, on a high level, in a roadmap: the roadmap shows actions, wherein each action—looking only at actions that are considered at the level of the roadmap, called "roadmap action" for convenience—comprises a complete plan with a sequence of or sub-actions, dependent actions, related actions, a timing of the sub-action (e.g. represented by a Gantt chart) and the allocation of resources to the sub-actions. If a particular roadmap action has problematic issues, for example, if there are not enough resources for performing the action within a required total time span, or if some sub-actions are not possible, or if a risk of one of the sub-actions is too high, etc. then this can be indicated in a representation of the roadmap, in particular in a visual representation of the roadmap.

From such problematic issues the manageability index, feasibility index and aggregated risk are determined. They are aggregated properties associated with a system context and are representative of an issue of this system context.

In embodiments, the method comprises the step of
performing actions defined by the roadmap in the real-world system.

This can mean performing all the actions defined by the roadmap, or at least one, or more. Actions performed in the real-world system cause changes to the real-world system. Thereby, closed-loop controlling the real-world system is implemented.

In embodiments, the method comprises
the step of determining the roadmap is iteratively repeated with at least one of a modified target task and modified planning parameters.

This repeating with modifications can be done automatically and can be based at least in part on user input, for example after a user's assessment of the aggregated risk, the manageability index and the feasibility index. This allows to create an optimal roadmap after making changes to the system, or to simulate the effect of a change before it is performed.

In embodiments, the method comprises the repeated execution of the steps of
first performing one or more of the actions defined by the roadmap in the real-world system;
and then performing the steps of receiving input data, updating attributes, determining a roadmap, resulting in a further (updated or amended) roadmap.

This allows for a constant update of the model as the implementation of a roadmap takes place, and a constant adaptation of the planning and the controlling to the actual state of the real-world system—as opposed to planning once and implementing the plan without considering any deviation from the planned outcome that may take place.

In embodiments, a risk artefact comprises
a likelihood of the real-world event occurring;
an impact of the real-world event; and
at least one mitigating action that reduces at least one of the likelihood and the impact.

In addition, a risk artefact can comprise one or more risk dependencies and/or one or more mitigating scenarios, wherein each mitigation scenario comprises actions that reduce at least one of the likelihood and the impact.

In embodiments, resources associated with an action artefact comprise
at least a time duration required for performing the action and physical resources required for performing the action.

In embodiments, computing the manageability index of the at least one system context is done by
determining, from the actions that are defined in the roadmap and that are associated with the action artefacts comprised by the system context, those actions for which not all resources that are required to perform the action are available,
associating each of those actions with an action specific manageability index and
computing the manageability index as a function of the action specific manageability index of those actions.

Those actions can be called resource-critical actions. It can be that the resources are unavailable only during a particular time interval (specified by the roadmap). The action specific manageability index can be determined depending on whether a resource is completely unavailable or only partly available. For example, a machine can be available for 10 hours, but an action requires it for 20 hours. The manageability index can be a weighted sum of the action specific manageability indices, with weights according to their relative importance for the action or the task at hand.

In embodiments, computing the feasibility index of the at least one system context is done by
determining, from the actions that are defined in the roadmap and that are associated with the action artefacts comprised by the system context, those actions for which not all conditions that must be satisfied for the action to be performed are satisfied,
associating each of those actions with an action specific feasibility index and
computing the feasibility index as a function of the action specific feasibility index of those actions.

Those actions can be called condition-critical actions. For example, in order for a robot to be able to operate, a power supply must be present. Similar to the above, the feasibility index can be a weighted sum of the a plurality of action specific feasibility indices.

In embodiments, computing the aggregated risk is done by evaluating risk dependencies that describe the dependence of risks from other risks and from other attributes.

Risks and aggregated risks can be related to the system being in a particular state or related to performing a task or to planning. The aggregated risk can be defined, by risk dependencies that are part of the model, explicitly in terms of other risks. Alternatively—depending on the type of risk, they can be automatically computed as a function of other risks.

Since many risks are computed, a display of a particular risk can be generated only if the risk is selected to be always displayed, or only when a threshold for this risk is exceeded.

In embodiments, the method comprises
representing, in the computer model, entities controlling an entity of the real-world system by controllability artefacts;
computing a susceptibility index of the at least one system context, the susceptibility index representing an extent to which the at least one system context is controllable;
creating and displaying, on the display device, a visual representation of the susceptibility index.

The entity being controlled can be a process, a machine, and the controllability artefact represents the way in which it is controlled. For example, it can represent an computer or embedded processor or hardwired controller for automatically controlling the entity. Alternatively, it can represent a human controller or operator. As a rule, an attribute representing controllability is higher ("better") when a process is fully automated. The susceptibility index can be computed from the controllability artefacts of the entities of the at least one system context, depending on what type they are of, if there is a risk of failure or degradation, and if they exist at all.

In embodiments, computing the susceptibility index of the at least one system context is done by
determining, for each of the actions that are defined in the roadmap and that are associated with the action artefacts comprised by the system context, a degree to which each of those actions is controllable, expressing this degree as an action specific susceptibility index and computing the susceptibility index as a function of the action specific susceptibility index of those actions.

Those actions can be called control-critical actions. An action can become less controllable depending on the degree to which the controllability artefact is available and in operation. This in turn depends on a risk associated with the controllability artefact.

In embodiments, an artefact is either a node artefact or an edge artefact, a node artefact representing a real-world object, and an edge artefact representing relations between real-world objects.

Such relations can be of different types, representing e.g. a flow of material, a flow of other resources and products, information exchange, support of a process by infrastructure, risk dependencies, an influence of one artefact one another (expressed in terms of attributes of these artefacts), etc.

In embodiments, the method comprises, for the at least one system context, determining interface relations, the interface relations being edge artefacts that relate artefacts of the at least one system context to artefacts outside the at least one system context, each interface relation comprising at least one relation value that characterises the relation;

computing one or more aggregated dependencies over these interface relations from the relation values of these interface relations.

This gives a high-level view of dependencies between a system context and the remainder of the system or another system context.

In embodiments, the interface relations are of different types, and computing the aggregated dependencies is done by determining, for each type of interface relations, an aggregated dependency for this type from the relation values of the interface relations of this type.

Depending on the type of the interface relations, and on the way in which they are represented (numeric values, logical values, fuzzy logic values, . . . ), the aggregation is done differently. Generally, the aggregation is done separately for each type of relation, e.g. separately for a flow of a particular material or product and for risks.

In embodiments, in the visual representation for each of the at least one system context a symbolic representation is generated, and at least one of the following properties of the symbolic representation is generated by setting at least one of a colour and a size of the symbolic representation according to the aggregated risk;

setting a position of the symbolic representation along a first axis according to the manageability index; and setting a position of the symbolic representation along a second axis according to the feasibility index.

Typically, the visual representation is a 2D representation. The first and second axes can be orthogonal to one another.

In embodiments, the method comprises setting at least one of the colour and the size of the symbolic representation according to the susceptibility index, unless it has been set according to the aggregated risk.

That is, if the colour is set according to the aggregated risk, then the size is set according to the susceptibility index, and vice versa.

Other visual properties such as a hatching, border thickness, type of shape (circle, square, polygon, other shape), shadow etc. can be used in place of or in addition to colour, size and position.

The data processing system for performing a model based analysis of a real-world system comprises: one or more hardware processors; and one or more hardware storage devices having stored thereon computer-executable instructions that are executable by the one or more hardware processors and that configure the system to perform the above method for the model based analysis of a real-world system.

The computer program product for performing a model based analysis of a real-world system comprises: one or more hardware storage memories having stored thereon computer-executable instructions that are executable by one or more hardware processors of a computer system, and that configure the computer system to perform the above method for model based analysis of a real-world system.

In an embodiment, a computer program product for the for the model based analysis of a real-world system is loadable into an internal memory of a digital computer or a computer system, and comprises computer-executable instructions to cause one or more processors of the computer or computer system execute the method for model based analysis of a real-world system. In another embodiment, the computer program product comprises a computer readable medium having the computer-executable instructions recorded thereon. The computer readable medium preferably is non-transitory; that is, tangible. In still another embodiment, the computer program is embodied as a reproducible computer-readable signal, and thus can be transmitted in the form of such a signal.

Further embodiments are evident from the dependent patent claims. Features of the method claims may be combined with features of the data processing system claims and vice versa.

The subject matter of the invention will be explained in more detail in the following text with reference to exemplary embodiments which are illustrated in the attached drawings, in which.

In principle, identical parts are provided with the same reference symbols in the figures.

Figure 1:
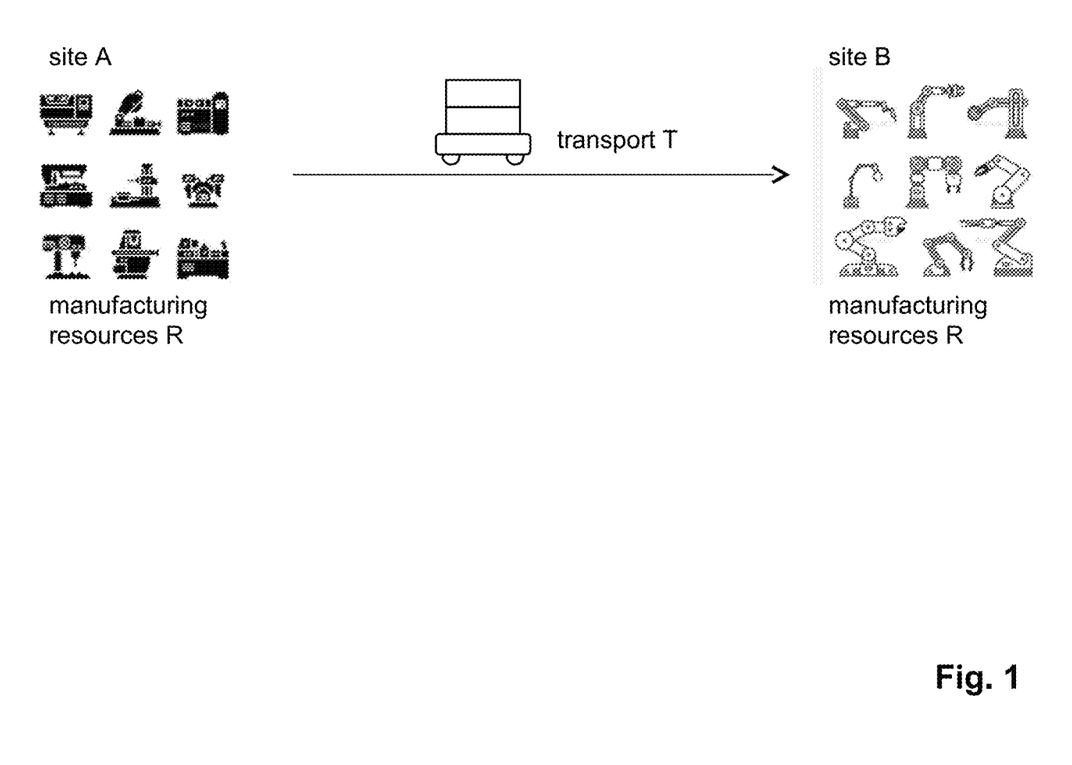
FIG. 1 schematically shows a real-world system.

FIG. 1 schematically shows a real-world system, with different processing or production locations A, B, and a transport system T, such as a fleet of autonomous vehicles. The production sites comprise infrastructure resources R such as machines. The system and its computer model comprise a multitude of further real-world entities and corresponding software objects or artefacts for modelling them in more detail, as described in the abovementioned documents.

Figure 2:
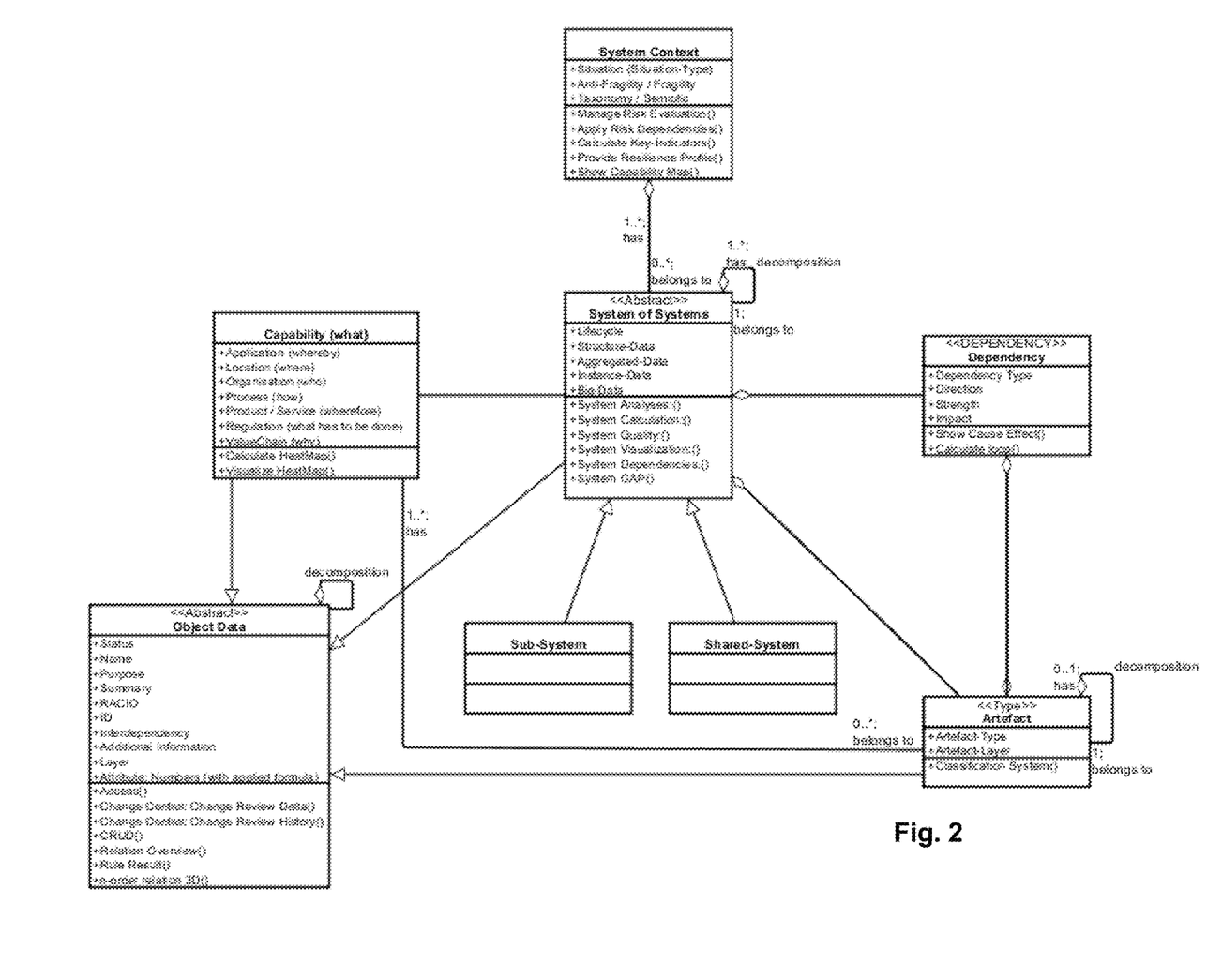
FIG. 2 shows a class diagram of objects used in the computer model of the real-world system.

FIG. 2 shows a class diagram the main objects used in the computer model modelling a real-world system. Details about underlying objects and the modelling methodology are described in U.S. Pat. No. 7,295,957 B2, U.S. Pat. No. 7,941,301 B2 ("Modeling"), U.S. Pat. No. 8,027,859 B2 ("Analysis"), U.S. Pat. No. 7,620,639 B2 ("Comparison"), which are hereby incorporated by reference.

Software objects, called artefacts, model all aspects of the real world that are of interest, thus not only physical entities, but also abstract properties of these entities such as

- a risk of partial or complete failure or of reduced capacity (risk artefacts), and relations between risks and other attributes. For example: "If the service interval for the autonomous transport vehicles is larger than two months, then there is a 50% risk of at least one vehicle failing in the next 24 hours", or a similar purely mathematical formula relating such attributes. A risk has an associated likelihood, an impact and mitigating action. The likelihood can be an attribute as shown above, the impact can be expressed by a relation that affects another artefact, and a mitigating action, modelled by an action artefact, has an effect on the likelihood and/or the impact. The action artefact can be used by a planning subsystem to change likelihood and/or impact, which may use resources and affect other artefacts, and can be considered in an optimisation procedure taking all these effects into account.
- a degree to which an entity depends on another one (support artefact). For example: "at nominal capacity, machine A requires 20% of the power provided by power supply B".
- actions that can be performed on such entities (action artefacts, involving the use of other entities (resources), such as raw materials, products, time, optionally operators, money used to acquire physical resources etc. For example: "in order to produce 1000 products of type C, 20 hours on machine A, 400 units of material D and 20,000 kWh or power are required".

Figure 3:
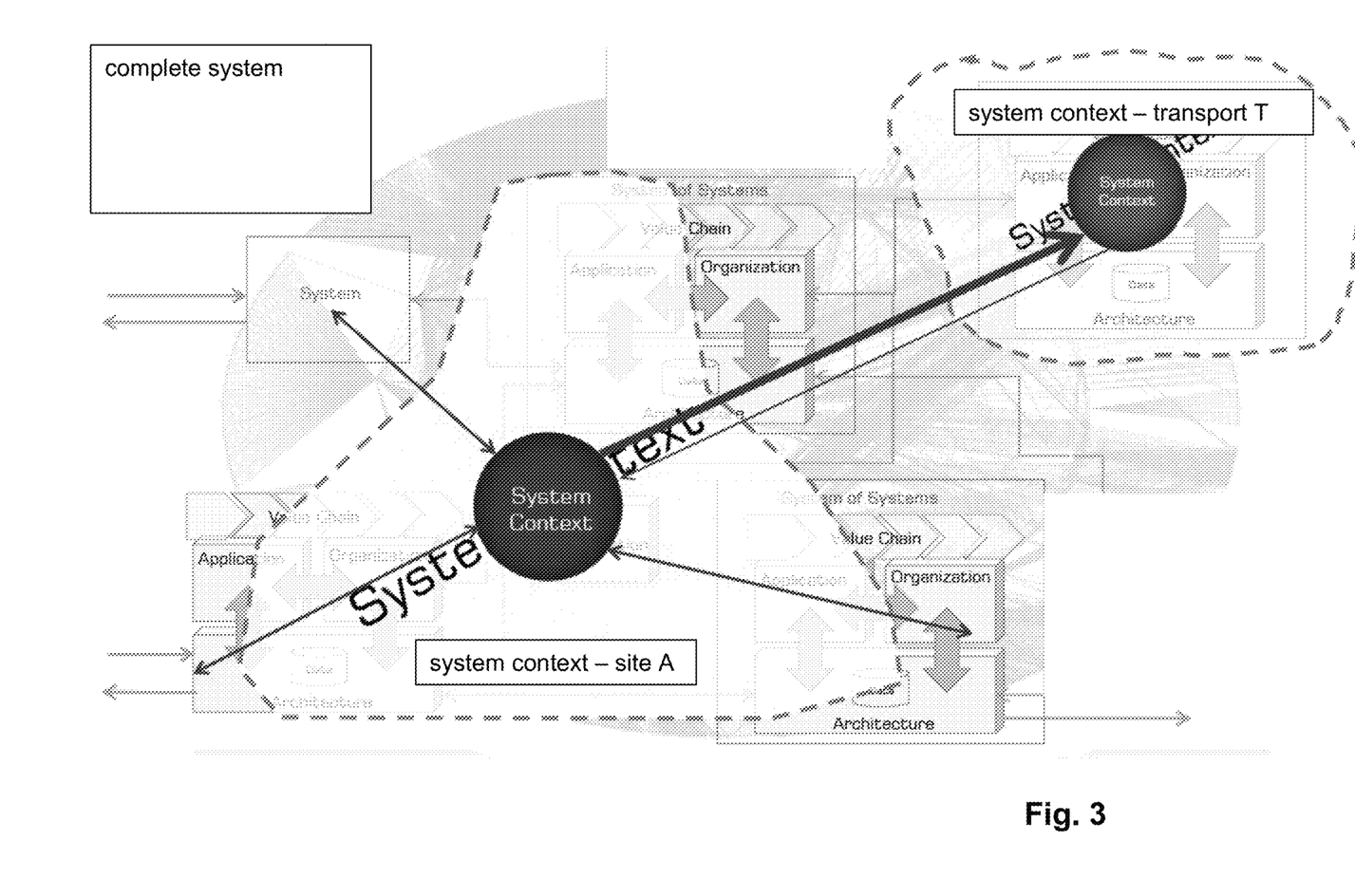
FIG. 3 schematically shows two system contexts as part of the system.

FIG. 3 schematically shows two system contexts as part of the complete system. The system contexts are typically defined by a user, depending on which parts are of interest for monitoring, analysis, planning and/or controlling. Defining such system contexts allows to aggregate data over the system context and thereby determine abstract or higher level information . . .

- that characterises the system context itself, by aggregating over system context.
- that characterises the relation of the system context to other parts of the system, by aggregating relations crossing boundaries. For example, a total material flow between the two sites A and B is modelled by adding all the material flow from A to B that is effected through different means, such as different transport vehicles. A total influence from the transport system T on site B is modelled by aggregating the influence that each transport vehicle has on the operation of site B, e.g. by the reliability of a transport vehicle affecting the time at which resources are delivered to a particular station of site B.

Parts of the system that are of less interest can be modelled with lower level of detail.

Figure 4:
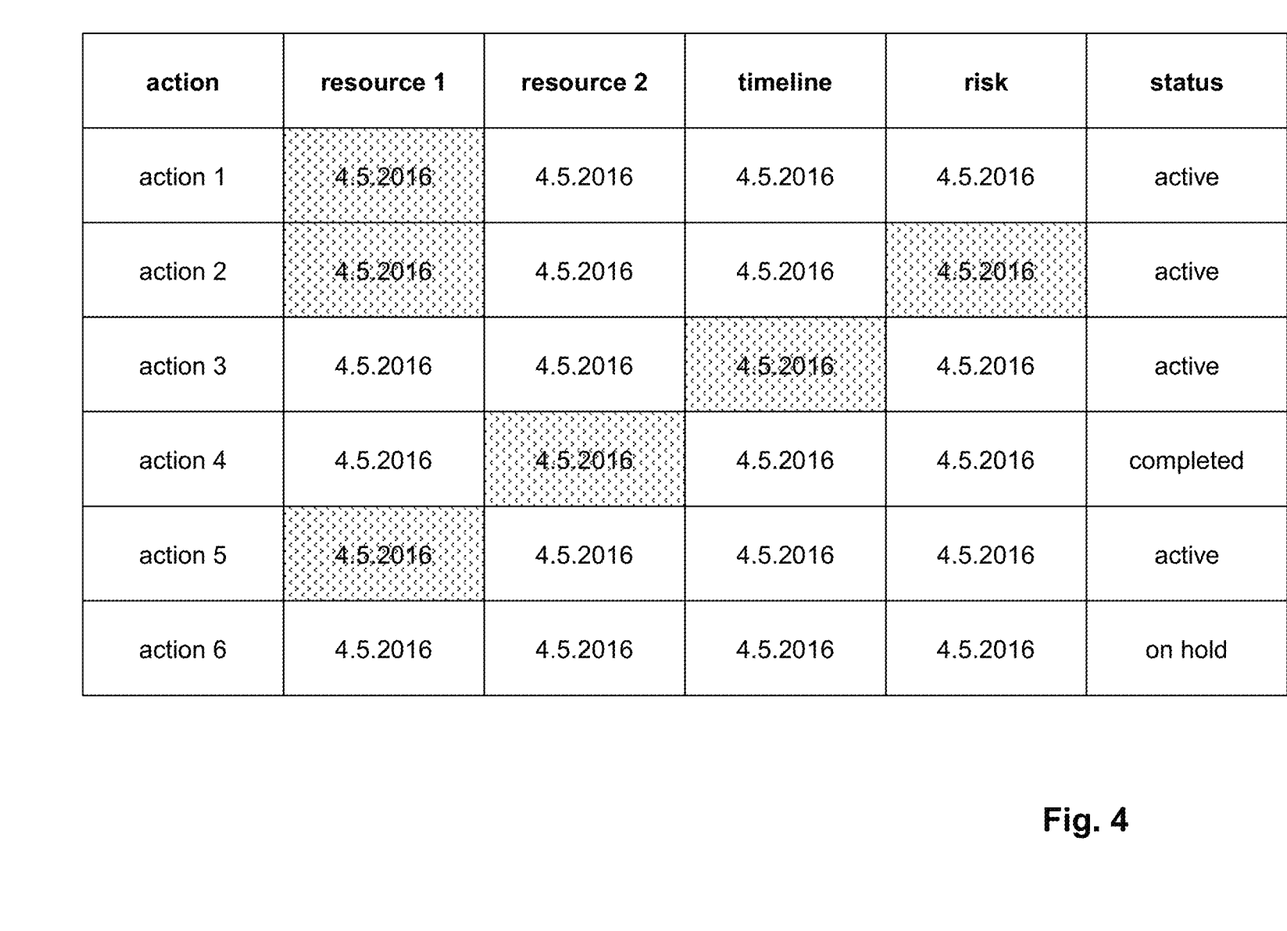
FIG. 4 shows a visual representation of a roadmap.

FIG. 4 shows a visual representation of a roadmap, in which each row represents an action, and the rows show corresponding high-level results of planning execution of the actions. In order to generate the roadmap, a planning subsystem searches for an optimal plan or schedule that implements all the actions required to accomplish a given target task. The actions to be considered are determined by matching the available action artefacts to the given target task, and considering any sub-actions in terms of which the actions are defined.

For example, the target task is "produce 100 units of product C", action 1 is "produce 100 units of subassembly A", action 2 is "produce 100 units of subassembly B", and action 3 is "assemble subassembly A and B to form product C". Each of these actions can be defined in terms of other (sub-)actions and uses resources such as machines, robots and transport vehicles, and some of these resources can be used by several actions.

The planning subsystem allocates resources required by the (sub-)actions and schedules the time for the actions to take place, subject to constraints and target functions. This involves taking into account that different actions can require the same resource, either in whole or in part, and that a resource usually is limited. The resulting roadmap defines a set of actions within the real world required to accomplish the target task and an allocation of resources to the actions. In the graphical representation, each row in the roadmap represents a plan for each of the actions, but does not show the plan itself, only high level aspects of the plan.

Depending on planning parameters such as optimisation criteria or target functions, some aspects of a plan can be critical. This is expressed by colouring or, as in the present example, hatching, corresponding row elements for each action. In the present example, elements are marked by hatching in which a particular resource is overused, or in which the time allocated for an action is not sufficient or in which a particular risk exceeds a given limit. The roadmap gives a high level overview of where problems lie, mitigation actions can be taken, or relaxation of boundary conditions imposed on the planner can considered. The dates shown in the elements of the roadmap shows the date at which the planning for the roadmap was done.

Figure 5:
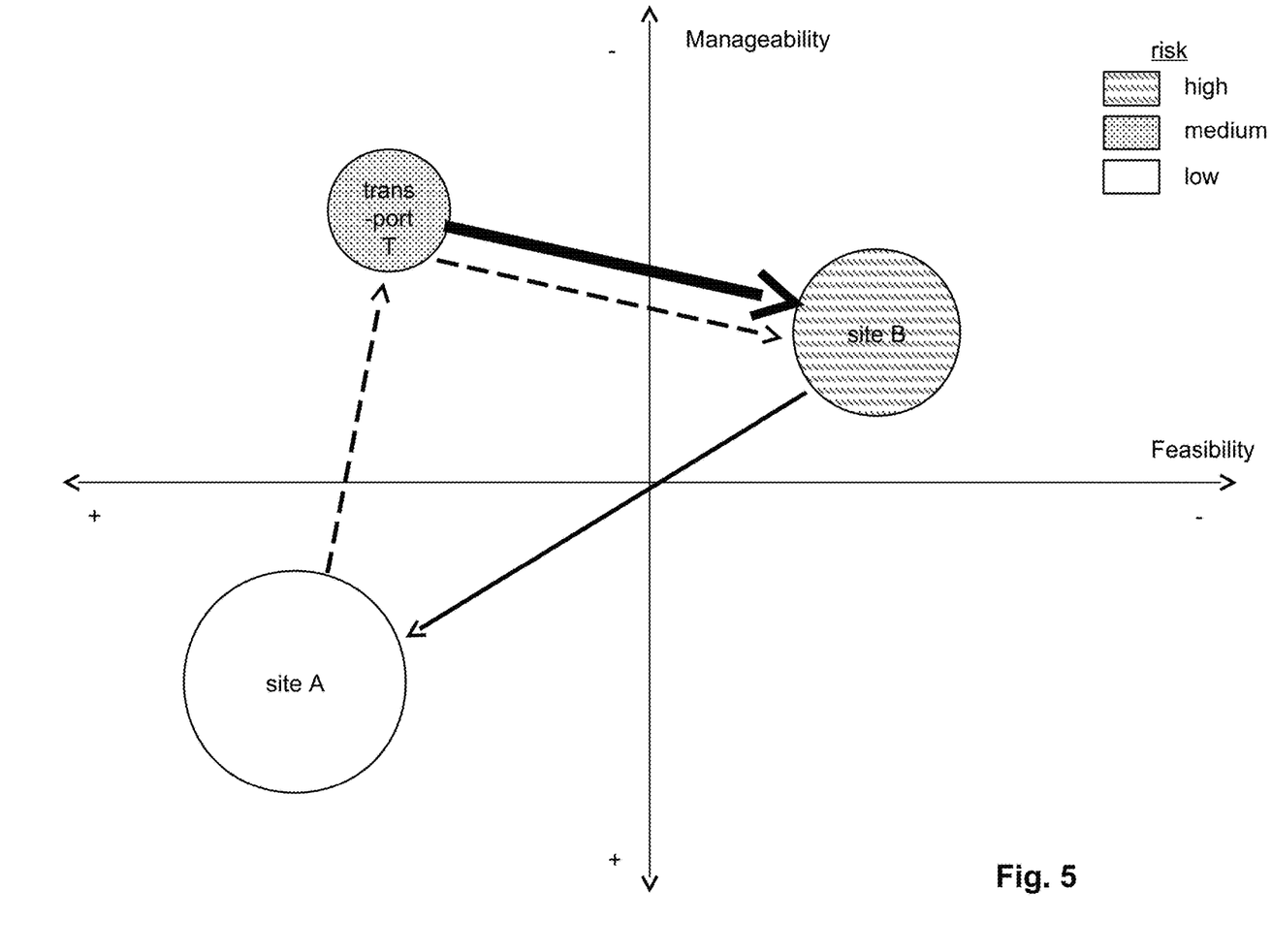
FIG. 5 shows a visual representation of aggregated properties of system contexts.

FIG. 5 shows a visual representation of the aggregated risk, the manageability index, the feasibility index and the susceptibility index for three system contexts "site A", "site B" and "transport (system) T". Each system context is represented by a an associated shape, in this case a circle. The representation can be used to show technical dynamic capabilities to manage system resilience with dependencies on a aggregated level.

The aggregated risk for each system context is represented by hatching or colour of the corresponding shape. It is computed from risks of artefacts of the respective system context. For example, an aggregated risk can be "capacity of the transport system" and can be computed from the risk of failure of the individual vehicles of the transport system. Depending on the capacity, the shape is coloured or hatched. The rules or mathematical formulae for computing the aggregated risk can be part of the model, that is, they are specified by a user who creates the mode.

The manageability index for each system context is represented by the position of the corresponding shape along the vertical axis. In the present example, negative (undesirable) values for manageability place the position in the upper half of the diagram. The manageability index is computed from the roadmap and the plans underlying the actions that are part of the roadmap. For each action, where not enough resources are available, the action is associated with a low action specific manageability index. A manageability index for the target task represented by the roadmap as computed from the action specific manageability indicia of the actions of the roadmap, for example as a weighted sum, with weights according to a relative importance or an effect of the action.

The feasibility index for each system context is represented by the position of the corresponding shape along the horizontal axis. In the present example, negative (undesirable) values for feasibility place the position in the right half of the diagram. The feasibility index is computed from the roadmap and the plans underlying the actions in a similar way as the manageability index. The difference is that the feasibility index and underlying action specific feasibility indicia represent that an action cannot be performed, for example, because at the moment it is technically impossible. For example, the capacity of a specific road is at its limits and therefore a transport system is close to collapse. Capacity could be improved if self-driving vehicles were available. This kind of technology is not available now, or cannot be implemented due to legal restrictions, therefore the improvement is not feasible The susceptibility index for each system context is represented by the size of the corresponding shape. In the present example, negative (undesirable) values for susceptibility are represented by larger shapes. The susceptibility index is computed from the roadmap and the plans underlying the actions by considering how the entities involved in the actions are controlled. For example, if a resource such as a machine or a production line is completely automated, then an associated controllability attribute has a high value, and conversely, an associated susceptibility is low. On the other hand, controlling entities such as computers have a certain risk of failure, then their susceptibility increases together with this risk. The same holds, if human interaction is required in the operation of a resource or in the execution of an action. From the controllability of resources and sub-actions that are required for an action, an action specific susceptibility index is computed. These action specific susceptibility indicia in turn are aggregated over each system context, resulting in its susceptibility index. As for the other aggregation methods, rules and algorithms for computing an aggregating these indicia can be programmed as part of the model.

The aggregated dependencies relating each system context to the others and the remainder of the system are represented by arrows and the thickness of the arrows.

For different types of dependencies, different types of arrows (colour, dotted, dashed, etc.) can be used.

For example, in the present example:

The dashed arrows represent an aggregated flow of products.

The bold arrow from system context "transport T" to system context "site B" represents a high risk of failures in the transport system affecting the output of "site B" with regard to a given production task.

The thin arrow from "site B" to "site A" represents a possibility that resources that are not used at "site B" could be reallocated to "site A"

"site A" has good feasibility and good manageability, risk is low (no hatching), but susceptibility is high, for example, because of lack of maintenance of controller software.

"transport T" has a medium risk corresponding to the risk of failures in the transport system and, resulting therefrom, has poor manageability due to lack of resources (transport vehicles).

"site B" has poor manageability because of lack of products, and poor feasibility because required technology is not available and a high risk because of miscalculations due to outdated or unavailable data. Therefore the system context becomes fragile While the invention has been described in present embodiments, it is distinctly understood that the invention is not limited thereto, but may be otherwise variously embodied and practised within the scope of the claims.

The invention claimed is:

1. A computer-implemented method for model based analysis of a real-world system, comprising:

providing a computer model, the computer model being a computer-based representation of the real-world system;

representing, in the computer model, entities of the real-world system by artefacts, an artefact being a software object, an artefact comprising attributes representing properties of the entities of the real-world system;

representing, in the computer model, risks of real-world events occurring by risk artefacts;

representing, in the computer model, actions within the real-world system, by action artefacts, an action artefact being associated with a task accomplished by an action, resources required to perform the action, and conditions that must be satisfied for the action to be performed;

at least one input apparatus receiving input data characterising properties the real-world system;

initialising or updating attributes of the artefacts according to the input data;

defining at least one system context, a system context comprising a subset of the artefacts of the computer model;

defining at least one target task to be accomplished within the real-world system;

determining, by means of a planning subsystem, a roadmap for accomplishing the target task, the roadmap defining a set of actions within the real world required to accomplish the target task and an allocation of resources to the actions, the planning subsystem taking into account planning parameters for guiding the planning;

computing, from the roadmap, a manageability index of the at least one system context, the manageability index representing an extent to which resources required for actions represented by the action artefacts of the at least one system context are available;

computing, from the roadmap, a feasibility index of the at least one system context, the feasibility index representing an extent to which actions required for action artefacts of the at least one system context are possible;

computing, from the risk artefacts of the at least one system context, an aggregated risk of the at least one system context for artefacts comprised by the at least one system context;

creating and displaying, on a display device, a visual representation of the aggregated risk, the manageability index and the feasibility index of the at least one system context;

wherein computing the manageability index of the at least one system context is done by determining, from the actions that are defined in the roadmap and that are associated with the action artefacts comprised by the system context, a first set of actions for which not all resources that are required to perform the action are available, associating each of the actions of the first set of actions with an action specific manageability index and computing the manageability index as a function of the action specific manageability index indices of the actions of the first set of actions.

2. The method of claim 1, comprising the steps of performing actions defined by the roadmap in the real-world system.

3. The method of claim 2, wherein the step of determining the roadmap is iteratively repeated with at least one of a modified target task and modified planning parameters.

4. The method of claim 2, comprising the repeated execution of the steps of
first performing one or more of the actions defined by the roadmap in the real-world system;
and then performing the steps of receiving input data, updating attributes, determining a roadmap, resulting in a further roadmap.

5. The method of claim 1, wherein a risk artefact comprises
a likelihood of a real-world event occurring;
an impact of the real-world event; and
at least one mitigating action that reduces at least one of the likelihood and the impact.

6. The method of claim 1, wherein resources associated with an action artefact comprise
at least a time duration required for performing the action and physical resources required for performing the action.

7. The method of claim 1, wherein computing the feasibility index of the at least one system context is done by
determining, from the actions that are defined in the roadmap and that are associated with the action artefacts comprised by the system context, a second set of actions for which not all conditions that must be satisfied for the action to be performed are satisfied,
associating each of the actions of the second set of actions with an action specific feasibility index and
computing the feasibility index as a function of the action specific feasibility indices of the actions of the second set of actions.

8. The method of claim 1, wherein computing the aggregated risk is done by evaluating risk dependencies that describe the dependence of a risk from one or more other risks and the dependence of a risk from one or more attributes.

9. The method of claim 1, comprising,
representing, in the computer model, entities controlling an entity of the real-world system by controllability artefacts;
computing a susceptibility index of the at least one system context, the susceptibility index representing an extent to which the at least one system context is controllable;
creating and displaying, on the display device, a visual representation of the susceptibility index.

10. The method of claim 9, wherein computing the susceptibility index of the at least one system context is done by
determining, for each of a third set of actions that are defined in the roadmap and that are associated with the action artefacts comprised by the system context, a degree to which each of those actions is controllable,
expressing, for each action of the third set of actions, this degree as an action specific susceptibility index and
computing the susceptibility index as a function of the action specific susceptibility indices of the actions of the third set of actions.

11. The method of claim 1, wherein an artefact is either a node artefact or an edge artefact, a node artefact representing a real-world object, and an edge artefact representing a relation between real-world objects.

12. The method of claim 11, comprising, for the at least one system context,
determining interface relations, the interface relations being edge artefacts that relate artefacts of the at least one system context to artefacts outside the at least one system context, each interface relation comprising at least one relation value that characterises the relation represented by the interface relation;
computing one or more aggregated dependencies over these interface relations from the relation values of these interface relations.

13. The method of claim 12, wherein the interface relations are of different types, and computing the aggregated dependencies is done by
determining, for each type of interface relations, an aggregated dependency for the type from the relation values of the interface relations of the type.

14. The method of claim 1, wherein in the visual representation for each of the at least one system context a symbolic representation is generated, and at least one property of the symbolic representation is generated by
setting at least one of a colour and a size of the symbolic representation according to the aggregated risk;
setting a position of the symbolic representation along a first axis according to the manageability index; and
setting a position of the symbolic representation along a second axis according to the feasibility index.

15. The method of claim 14, comprising,
representing, in the computer model, entities controlling an entity of the real-world system by controllability artefacts;
computing a susceptibility index of the at least one system context, the susceptibility index representing an extent to which the at least one system context is controllable;
creating and displaying, on the display device, a visual representation of the susceptibility index; and
setting at least one of the colour and the size of the symbolic representation according to the susceptibility index, unless it has been set according to the aggregated risk.

16. The method of claim 15, wherein computing the susceptibility index of the at least one system context is done by
determining, for each of a fourth set of actions that are defined in the roadmap and that are associated with the action artefacts comprised by the system context, a degree to which each of those actions is controllable,
expressing for each action of the fourth set of actions, this degree as an action specific susceptibility index and
computing the susceptibility index as a function of the action specific susceptibility indices of the actions of the fourth set of actions.

17. A system comprising: one or more hardware processors; and one or more hardware storage devices having stored thereon computer-executable instructions that are executable by the one or more hardware processors and that configure the system to perform, for model based analysis of a real-world system, the steps of claim 1.

18. A computer program product comprising one or more hardware storage memories having stored thereon computer-executable instructions that are executable by one or more hardware processors of a computer system, and that configure the computer system to perform, for model based analysis of a real-world system, the steps of claim 1.

* * * * *